(12) United States Patent
Gao et al.

(10) Patent No.: US 11,740,139 B2
(45) Date of Patent: Aug. 29, 2023

(54) FLOW GUIDING AND HEAT DISSIPATING TYPE DRY BLOCK TEMPERATURE CALIBRATOR

(71) Applicant: BEIJING CONST INSTRUMENTS TECHNOLOGY INC., Beijing (CN)

(72) Inventors: Hongjun Gao, Beijing (CN); Wei Ji, Beijing (CN); Xuecan Li, Beijing (CN); Gang Wang, Beijing (CN); Chunying Zhang, Beijing (CN); Jianjun Lin, Beijing (CN)

(73) Assignee: BEIJING CONST INSTRUMENTS TECHNOLOGY INC., Beijing (CN)

( * ) Notice: Subject to any disclaimer, the term of this patent is extended or adjusted under 35 U.S.C. 154(b) by 574 days.

(21) Appl. No.: 16/961,014

(22) PCT Filed: Jan. 8, 2019

(86) PCT No.: PCT/CN2019/070730
§ 371 (c)(1),
(2) Date: Jul. 9, 2020

(87) PCT Pub. No.: WO2019/137343
PCT Pub. Date: Jul. 18, 2019

(65) Prior Publication Data
US 2021/0063253 A1    Mar. 4, 2021

(30) Foreign Application Priority Data

Jan. 9, 2018 (CN) .......................... 201810018505.9
Jan. 9, 2018 (CN) .......................... 201820032127.5

(51) Int. Cl.
*G01K 15/00* (2006.01)
*H05K 7/20* (2006.01)

(52) U.S. Cl.
CPC ......... *G01K 15/002* (2013.01); *G01K 15/005* (2013.01); *H05K 7/20209* (2013.01)

(58) Field of Classification Search
CPC .... G01K 15/002; G01K 15/005; G01K 15/00; H05K 7/20209
See application file for complete search history.

(56) References Cited

U.S. PATENT DOCUMENTS 3,350,915 A * 11/1967 Staffin .................. G01K 15/005
374/3
6,663,277 B1 * 12/2003 Sandmæl ............... G01K 15/00
374/3

(Continued)

FOREIGN PATENT DOCUMENTS

CN          101639390 A      2/2010
CN          204389067 U      6/2015

(Continued)

OTHER PUBLICATIONS

Sep. 9, 2021 Search Report issued in European Patent Application No. 19738531.3.

(Continued)

*Primary Examiner* — Gail Kaplan Verbitsky
(74) *Attorney, Agent, or Firm* — Oliff PLC

(57) ABSTRACT

A flow guiding and heat dissipating type dry block temperature calibrator, which belongs to the temperature calibration field. The temperature calibrator includes a furnace body located in a housing and at least one air flow generating device. The air flow generating device is on one side or at the periphery of the furnace body, and is one or a combination of a gas passage, a flow guiding fan, an air pump and a blower. The air flow generated by the air flow generating device is blown toward a handle of a device being tested that (Continued)

is inserted in the furnace body, such that the handle is cooled, thereby preventing the sensor inside the handle from failing due to high temperature, facilitating the heat dissipation of the internal electronic components of the instrument itself, and extending the service life of the temperature calibrator.

10 Claims, 6 Drawing Sheets

(56) References Cited

U.S. PATENT DOCUMENTS

| | | | | |
|---|---|---|---|---|
| 11,402,278 | B2* | 8/2022 | Lin | G01K 7/12 |
| 2007/0289314 | A1 | 12/2007 | Liebmann et al. | |
| 2009/0064603 | A1* | 3/2009 | James | G01K 15/00 |
| | | | | 52/169.5 |
| 2013/0148687 | A1* | 6/2013 | Sjogren | G01K 15/005 |
| | | | | 374/1 |
| 2014/0153606 | A1* | 6/2014 | Walker | F27D 11/00 |
| | | | | 373/135 |

FOREIGN PATENT DOCUMENTS

| | | | | |
|---|---|---|---|---|
| CN | 106248253 A | * | 12/2016 | ........... G01K 15/005 |
| CN | 207675335 U | | 7/2018 | |
| CN | 207675335 U | * | 7/2018 | ........... G01K 15/002 |
| CN | 207866391 U | | 9/2018 | |
| CN | 207866392 U | | 9/2018 | |
| CN | 115515396 A | * | 12/2022 | |
| EP | 2399107 B1 | * | 1/2013 | ........... G01K 15/005 |
| EP | 2835623 A1 | * | 2/2015 | ........... G01K 15/005 |
| EP | 3816696 A1 | * | 5/2021 | ..... G02B 15/143507 |
| FR | 2920910 A1 | * | 3/2009 | ............. G01K 15/00 |
| FR | 2923604 A1 | * | 5/2009 | ........... G01K 15/002 |
| JP | H0792037 A | * | 7/1998 | |
| WO | WO-9904231 A1 | * | 1/1999 | ............. G01K 15/00 |
| WO | WO-2019137330 A1 | * | 7/2019 | ............. F27D 19/00 |
| WO | WO-2019137331 A1 | * | 7/2019 | ............. F16K 1/223 |

OTHER PUBLICATIONS

Mar. 29, 2019 International Search Report issued in International Patent Application No. PCT/CN2019/070730.

Jul. 14, 2020 International Preliminary Report on Patentability issued in International Patent Application No. PCT/CN2019/070730.

* cited by examiner

[FIG. 1A]
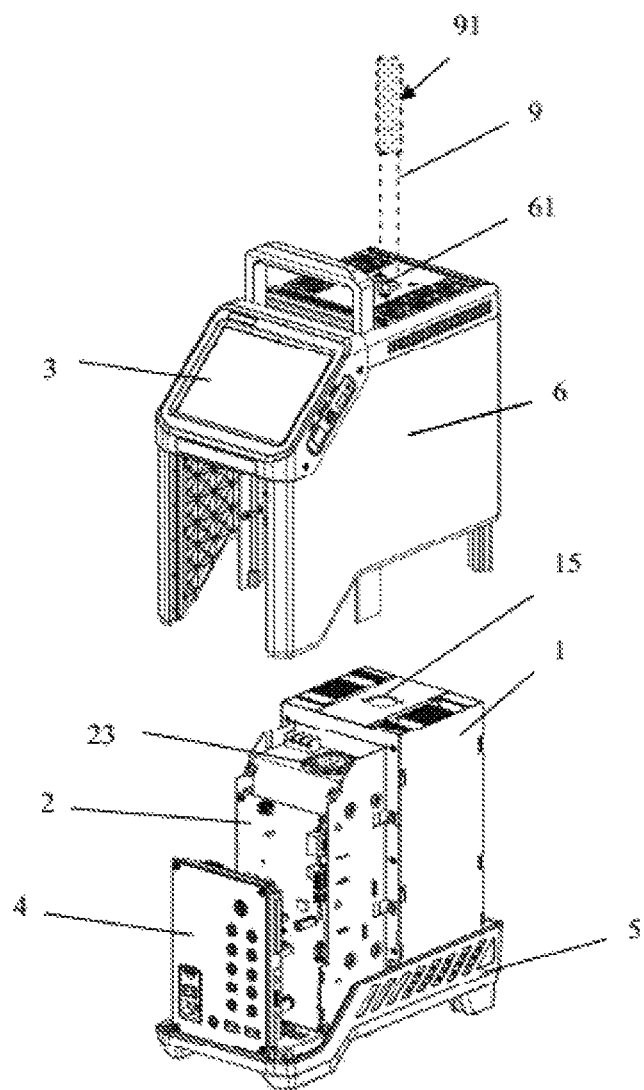

[FIG. 1B]
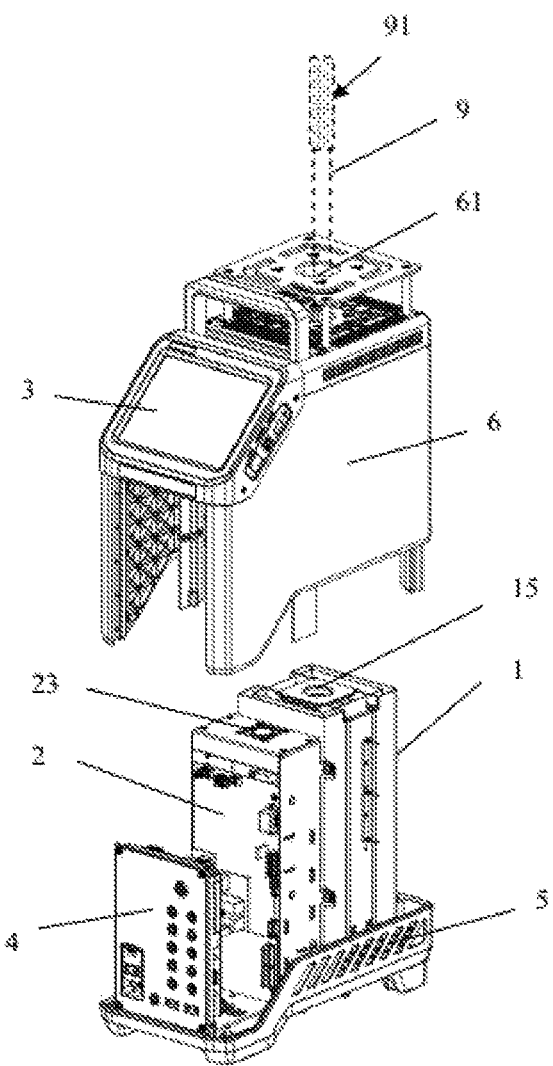

[FIG. 2]
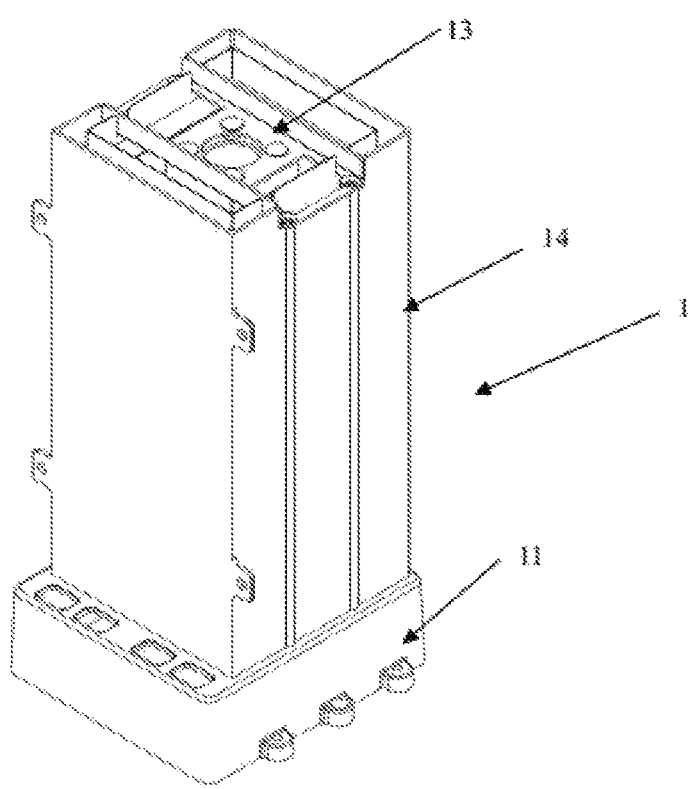

[FIG. 3]
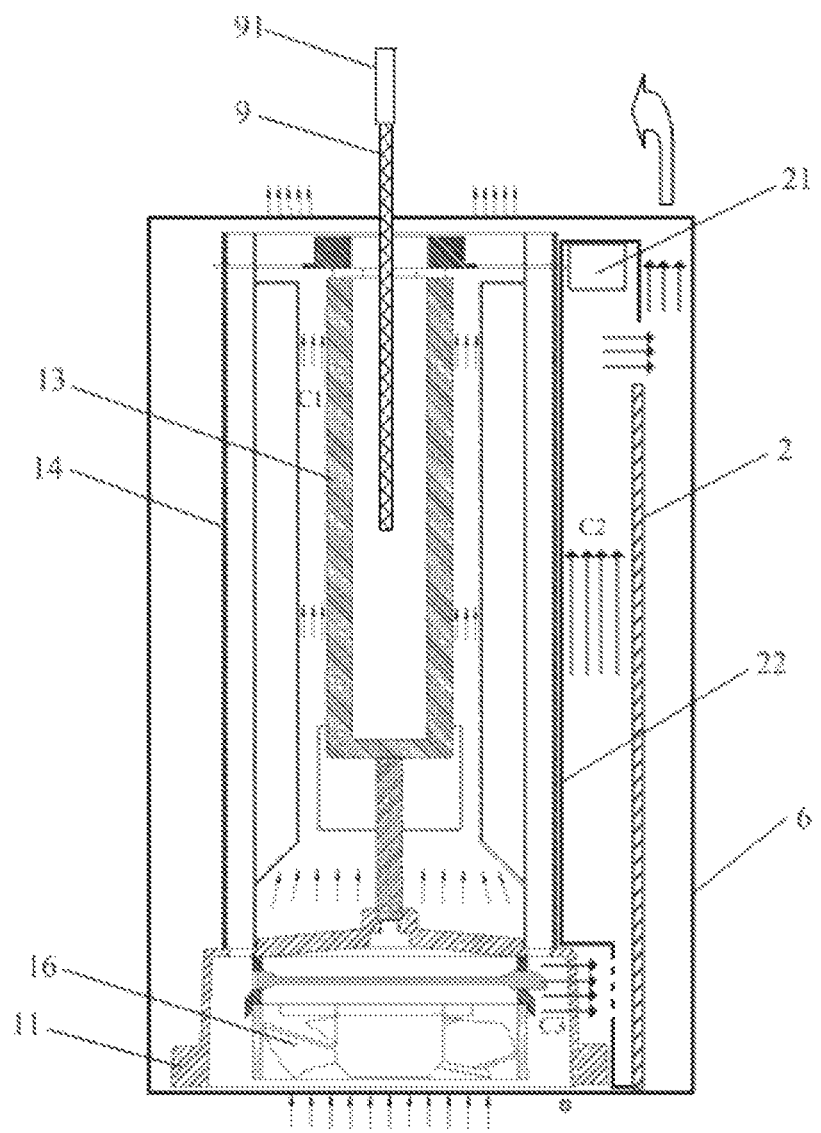

[FIG. 4]
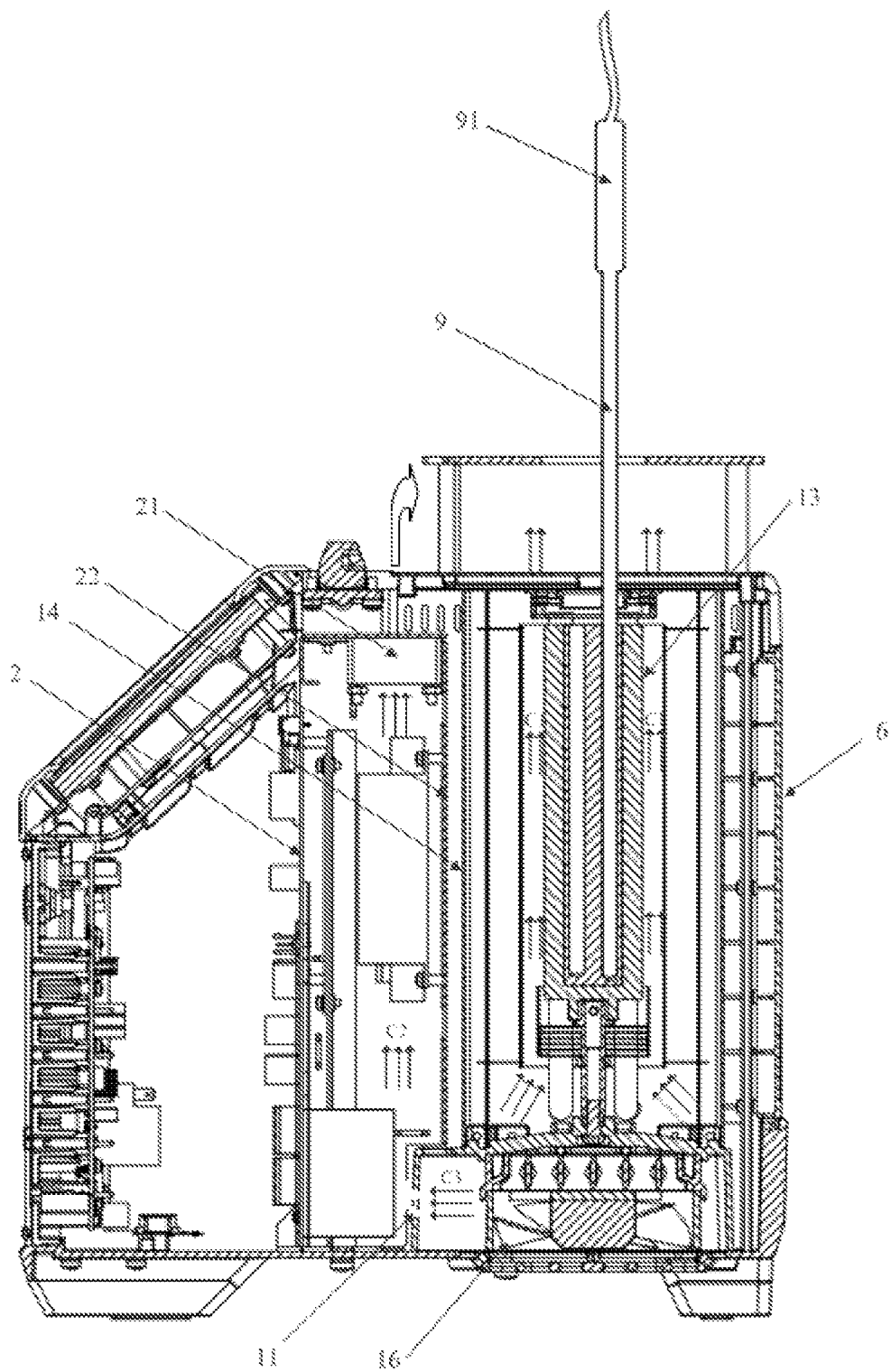

[FIG. 5]
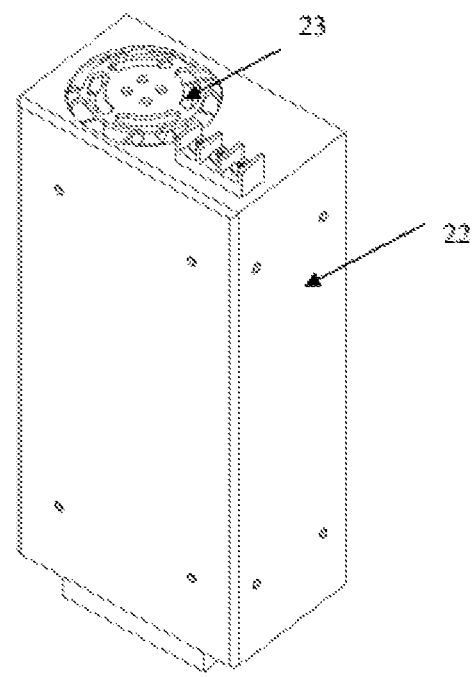

_US 11,740,139 B2_

FLOW GUIDING AND HEAT DISSIPATING TYPE DRY BLOCK TEMPERATURE CALIBRATOR

TECHNICAL FIELD

The present invention belongs to the field of temperature calibration, and relates in particular to a dry block temperature calibrator, more specifically to a dry block temperature calibrator with a function of flow guiding and heat dissipating.

BACKGROUND ART

The dry block temperature calibrator is used to calibrate thermometers or thermal switches, etc. It is widely used in industrial sites, metering places and laboratories in various industries, and has a relatively wide market.

Existing portable dry block temperature calibrator is usually provided with a furnace body and a housing that is easy to carry. The furnace body includes a heat-equalizing block (furnace core), a constant temperature block with heating or/and refrigerating device, a heat insulation layer and a cooling fan. The heat-equalizing block has a central cavity to receive a device to be tested, such as a thermometer or thermal switch to be tested. The constant temperature block and the heat insulation layer are spaced apart by a certain distance to form a heat dissipation passage C1. An air flow generated by the cooling fan disposed at the bottom of the furnace body flows from bottom to top in the heat dissipation passage, thereby achieving cooling and heat dissipation inside the furnace body. However, due to the relative high temperature inside the furnace body, the temperature of the gas flowing out of the heat dissipation passage C1 is also high, resulting in an excessive high temperature of a handle of the tested device near the furnace opening, which further causes damage to the sensors inside the handle of the tested device.

SUMMARY OF INVENTION

It is therefore an object of the present invention to provide a dry block temperature calibrator with a function of flow guiding and heat dissipating in view of the above defects.

According to an aspect of the present invention, a flow guiding and heat dissipating type dry block temperature calibrator comprising: a housing (6); a furnace body (1) disposed in the housing (6); and at least one air flow generating device disposed in the housing (6) and at the periphery of the furnace body (1), wherein an air flow generated by the air flow generating device is blown toward a handle (91) of a device to be tested that is inserted into the furnace body (1).

In the flow guiding and heat dissipating type dry block temperature calibrator, the air flow generating device is formed in a single one, which is provided on one side of the furnace body, or the air flow generating device is formed in plurality, which are distributed at the periphery of the furnace body.

In the flow guiding and heat dissipating type dry block temperature calibrator, the air flow generating device includes at least one of a flow guiding fan (21), an air pump and a blower.

In the flow guiding and heat dissipating type dry block temperature calibrator, the air flow generating device is mounted on a mounting frame or a mounting plate positioned on one side of the furnace body, and the mounting frame or the mounting plate is fixed to a housing base (5) of the dry block temperature calibrator.

In the flow guiding and heat dissipating type dry block temperature calibrator, the dry block temperature calibrator further comprises a control board bracket (22) for installing a control board (2), the air flow generating device is installed on the mounting plate (2) or the mounting frame, the mounting plate is mechanically fixed on a top end of the control board bracket (22), and a bottom end of the control board bracket (22) is fixed on the housing base (5).

The flow guiding and heat dissipating type dry block temperature calibrator further comprises a cooling fan (16) disposed in the housing (6) and below the furnace body (1), wherein the air flow generating device comprises: one or more gas passages C2 arranged on the periphery of the furnace body (1) and communicated with the cooling fan (16) or other gas sources; and a flow guiding fan (21), an air pump or a blower provided inside the gas passage C2.

In the flow guiding and heat dissipating type dry block temperature calibrator, the gas passage C2 is a rectangular parallelepiped cylinder, a round cylinder or an air duct arranged on one side of the furnace body (1).

In the flow guiding and heat dissipating type dry block temperature calibrator, the gas passage C2 is a rectangular parallelepiped cylinder enclosed by the control board bracket (22) and the control board (2), wherein the control board bracket (22) is of a rectangular groove structure, a side opening of which is partially covered by the control board (2), and wherein a fan mounting plate is provided at an air outlet of the rectangular parallelepiped cylinder, the flow guiding fan (21) is mechanically fixed below the fan mounting plate, and the fan mounting plate is provided with an opening corresponding to the position of the flow guiding fan (21).

In the flow guiding and heat dissipating type dry block temperature calibrator, a furnace base (11) is provided below the furnace body (1), the cooling fan (16) is disposed in a lower cavity of the furnace base (11), and at least one vent is formed on a side wall of the furnace base (11) adjacent to the gas passage to form a gas passage C3, so that the air flow generated by the cooling fan (13) flows to an air inlet below the gas passage C2.

In the flow guiding and heat dissipating type dry block temperature calibrator, the air flow generating device is only a gas passage C2 arranged on one side of the furnace body and communicated with a cooling fan or an external gas source.

In the flow guiding and heat dissipating type dry block temperature calibrator, a direction of the air flow generated by the flow guiding fan (21), the air pump or the blower is vertically upward or inclined to one side of the furnace body.

According to the above aspect, the present invention forms an air flow generating device by one or a combination of the gas passage C2, the flow guiding fan, the air pump and the blower. The air flow generated by the air flow generating device can be guided to and act on the handle of the device to be tested to cool down the handle, thereby preventing the sensor inside the handle from failing due to high temperature, facilitating the heat dissipation of the internal electronic components of the instrument itself, and extending the service life of the temperature calibrator.

BRIEF DESCRIPTION OF THE DRAWINGS

FIG. 1A is an exploded view of the components of a flow guiding and heat dissipating type dry block temperature calibrator (a low temperature furnace) according to the present invention;

FIG. 1B is an exploded view of the components of a flow guiding and heat dissipating type dry block temperature calibrator (a high temperature furnace) according to the present invention;

FIG. 2 is a schematic diagram of the structure of the furnace body according to the present invention;

FIG. 3 is a schematic diagram of an air flow generating device according to the present invention, which is a gas passage and a fan in combination;

FIG. 4 is a schematic cross-sectional view of the flow guiding and heat dissipating type dry block temperature calibrator according to the present invention; and FIG. 5 is a perspective view of the air flow generating device according to the present invention, which is a flow guiding fan mounted on the control board bracket.

DETAILED DESCRIPTION OF THE EMBODIMENT(S)

The present invention provides a dry block temperature calibrator with a function of flow guiding and heat dissipating. Referring first to FIGS. 1A and 1B, the dry block temperature calibrator includes a housing 6 for the instrument and a furnace body 1 disposed in the housing 6, and may further include a control board 2 assembled in the housing 6 in parallel to the furnace body 1. The housing 6 is provided with a insertion hole 61 opposed to a furnace opening 15 of the furnace body 1, and the insertion hole 61 is configured for insertion of a device to be tested 9.

As illustrated in FIGS. 2 and 3, the furnace body 1 includes a heat-equalizing block, a constant temperature block 13, and a heat insulation layer 14 disposed around the constant temperature block 13. A furnace base 11 is provided below the furnace body 1, and the constant temperature block 13 and the heat insulation layer 14 are disposed on the furnace base 11. Within a lower cavity of the furnace base 11 there is mounted a cooling fan 16. The constant temperature block 13 surrounds the heat-equalizing block (furnace core). An upper end of the heat-equalizing block has an opening, that is, the furnace opening 15 for receiving the device to be tested 9. Inside the constant temperature block 13 there is also included a heat source being in thermal contact with the heat-equalizing block. The heat insulation layer 14 is disposed around the constant temperature block 13, with the heat insulation layer 14 and the constant temperature block 13 being spaced apart by a certain distance to form a heat dissipation passage C1 inside the furnace body. When the temperature of the furnace body 1 needs to be lowered, the cooling fan 16 at the bottom of the furnace body 1 operates so that heat generated by the furnace core is discharged from exhaust holes above the furnace body 1 through the heat dissipation passage C1 (the air flow inside the furnace body is shown by the fine arrows in FIG. 3).

In the present invention, air flow generating devices for flow guiding and heat dissipating of the instrument and capable of generating a directional air flow are provided between the peripheral heat insulation layer 14 around the furnace body 1 and the housing 6. The air flow generating devices are located inside the housing 6 and outside the furnace body 1.

The number of the air flow generating devices is not limited, and they can be arranged according to actual needs, provided that the locations thereof are such that the air flow generated by the air flow generating devices can act on a handle 91 of the device to be tested 9, causing the handle 91 and the sensors inside the handle 91 to be cooled down. It can be understood that a single air flow generating device may be provided on one side of the furnace body 1, or a plurality of air flow generating devices may be provided on the periphery of the furnace body 1. Further, the plurality of air flow generating devices can be arranged at regular intervals. When the furnace body 1 is a rectangular parallelepiped, the air flow generating devices may be disposed adjacent to one or more sides of the furnace body 1.

In a first instance, one embodiment of the air flow generating device is a gas passage C2 communicating with a gas source. As shown in FIG. 3, there are one or more of the gas passages, which are arranged at the periphery of the furnace body 1. The form of the gas passage C2 is not limited, as long as it can serve to guide the air flow from the gas source to the handle of the device to be tested 9. It can be understood that the gas source may be the cooling fan 16 at the bottom of the furnace body, or may be a natural air flow outside the furnace body or other gas sources.

Further, a bottom end of the gas passage C2 is provided with an air inlet communicating with the air source so that an air flow enters the gas passage C2. A top end of the gas passage C2 is provided with an air outlet so that the air flow flows through the air outlet to the handle 91 of the device to be tested 9. Specifically, the gas passage C2 may be formed as a rectangular parallelepiped cylinder enclosed by four rectangular plates, or a round cylinder or a long duct. When there are a plurality of gas passages C2, they may communicate with each other, and each of the air outlets of all the gas passages C2 is directed toward the handle 91 of the device to be tested 9, or alternatively, all the gas passages may have only one air outlet provided to direct toward the handle 91 of the device to be tested 9.

In one embodiment, as shown in FIG. 3, the gas passage C2 is a vertical rectangular parallelepiped passage enclosed by the control board 2 and a control board bracket 22. The control board bracket 22 is of a rectangular groove structure enclosed by three long rectangular plates, a side opening of which is partially closed by the control board 2, leaving the upper and lower openings unclosed. The gas passage C2 guides the air flow generated by the cooling fan 16 located below the furnace body from below the furnace body to the handle 91 of the device to be tested 9. It can be understood that the cooling fan 16 is located in the cavity of the furnace base 11, and the side wall of the furnace base 11 adjacent to the gas passage C2 is provided with a plurality of vents to allow the air flow generated by the cooling fan 16 to enter the gas passage C2 through the air inlet at the bottom end of the gas passage C2. For example, as shown in FIG. 3, a gas passage C3 is formed between the bottom of the furnace body 1 and the furnace base 11. As such, the cavity at the bottom of the furnace body 1, where the cooling fan 16 is located, communicates with the gas passage C2 outside the furnace body 1 through the gas passage C3. The air flow generated by the cooling fan 16 exits the instrument housing 6 through the gas passage C3 and the gas passage C2, and can be guided to the handle 91 of the device to be tested 9.

In a second instance, another embodiment of the air flow generating device is one or a combination of a flow guiding fan 21, an air pump, and a blower located on one or more sides of the furnace body.

In one embodiment, the air flow generating device is a flow guiding fan 21, an air pump or a blower provided on one side of the furnace body. It can be understood that there may be a plurality of flow guiding fans 21 respectively provided on a plurality of sides of the furnace body, which together generate air flow to cool down the handle 91 of the device to be tested 9. The air flow generating device is provided on a mounting frame or a mounting plate positioned on one side of the furnace body. The height of the air flow generating device can be adjusted by changing the height of the mounting frame or the position of the mounting plate. Specifically, referring to FIG. 5 along with FIG. 1A, the mounting plate 23 is disposed above the control board bracket 22, and the height of the control board bracket 22 is lower than the height of the furnace body, so that the flow guiding fan 21 mounted on the mounting plate 23 is located on one side of the furnace body and is slightly lower than the height of the furnace body, thereby forming a space in the housing 6 that facilitates the operation of the flow guiding fan 21. Therefore, the air flow generated by the flow guiding fan 21 can act on the handle 91 of the device to be tested 9 to perform cooling down.

In a third instance, yet another embodiment of the air flow generating device is a combination of one or more of a flow guiding fan 21, an air pump, and a blower provided on one side of the furnace body and a gas passage C2. A mounting plate may be provided on the top, middle, or lower portion of the gas passage C2 to install the flow guiding fan 21, the air pump, and the blower. In the present embodiment, as shown in FIGS. 3 and 4, the gas passage C2 is a vertical rectangular parallelepiped air duct enclosed by the control board 2 and the control board bracket 22. The control board bracket 22 is of a rectangular groove structure enclosed by three rectangular plates, a side opening of which is partially closed by the control board 2 to form the gas passage C2. A top end opening of the gas passage C2 is closed by a fan mounting plate, and the flow guiding fan 21 is mounted below the fan mounting plate. The fan mounting plate is provided with an opening at a position corresponding to the flow guiding fan 21 to allow air flow generated by the flow guiding fan 21 and the gas passage C2 to pass therethrough. An air inlet at the bottom end of the gas passage C2 communicates with the air flow generated by the cooling fan 16. The cooling fan 16 is disposed in the cavity of the furnace base 11. A side wall of the furnace base 11, which is adjacent to the gas passage C2 and provided with vents, forms a gas passage C3. The air flow generated by the cooling fan 16 sequentially passes through the air passage C3, the air inlet of the gas passage C2, and the opening of the fan mounting plate to exit the housing 6.

When the air flow generating device is a flow guiding fan 21, the flow guiding fan 21 can be placed horizontally on one side of the furnace body 1, or can be inclined at a certain angle, so that the air flow generated by the flow guiding fan 21 flows more easily toward the furnace body 1. Preferably, an inclination angle of the flow guiding fan 21 to the side of the furnace body 1 is between 0 degree and 90 degree, so that the fan surface of the flow guiding fan 21 faces the furnace body 1 even more.

It can be understood that the above described air flow generating device may have the flow guiding fan 21 replaced with an air pump and a blower. The speed of the flow guiding fan 21, and the operating power of the air pump and the blower may be adjusted according to actual needs, so as to generate different air amounts to achieve different cooling effects for the handle of the device to be tested 9.

It can be understood that a housing base 5 is further provided below the housing 6. The housing base 5 and the housing 6 are fitted vertically with each other to form a detachable housing structure, thereby facilitating maintenance and replacement of internal components of the dry block temperature calibrator. A vent is provided below the housing base 5 to allow external air or gas sources to enter the interior of the dry block temperature calibrator. The dry block temperature calibrator of the present invention further includes a measurement board module 4 and a system board module 3 disposed inside the housing 6. The measurement board module 4 is used for connection to a measurement line to realize the electrical measurement function of the dry block temperature calibrator, and the system board module 3 is used for parameter setting and data display to realize human-machine interaction.

The operating principle of the flow guiding and heat dissipating type dry block temperature calibrator provided by the present invention is as follows: the air flow generated by the air flow generation device flows around the temperature calibrator, so that a part of the air flow flows in a direction toward the handle of the device to be tested. The part of the air flow is of a normal temperature, thereby reducing the high temperature of the handle of the device to be tested near the opening of the furnace core (the heat-equalizing block), and also causing the hot air flow around the handle of the device to be tested blown away from the furnace body by the air flow generated by the air flow generating device, and thus reducing the temperature of the handle of the device to be tested.

Implementation Effects

When the air flow generating device is applied to a high temperature dry block temperature calibrator, as shown in FIG. 1B, the flow guiding fan 21 and the gas passages work together. When the speed of the flow guiding fan is 6000 rpm, the temperature of the handle of the device to be tested is reduced from 133 degree to 61 degree, and when the speed of the flow guiding fan is 8000 rpm, the temperature of the handle is further reduced to 48 degree.

In specific implementation, the air flow generating device proposed by the present invention is applicable to any one of existing or various newly developed temperature calibrators, furnace bodies, etc. A person skilled in the art can make various modifications according to the present invention in combination with the form of a specific furnace body or temperature calibrator, and these modifications also belong to the disclosure of the present invention.

REFERENCE NUMERALS 1 furnace body
3 system board module
4 measurement board module
5 housing base
16 cooling fan
11 furnace base
13 constant temperature block
14 heat insulation layer
15 furnace opening
2 control board
21 flow guiding fan
22 control board bracket
23 mounting plate
6 housing
61 insertion hole
9 device to be tested
91 handle (device to be tested)

The invention claimed is:

1. A flow guiding and heat dissipating type dry block temperature calibrator comprising:
a housing;
a furnace body disposed in the housing;
at least one air flow generating device disposed in the housing and at a periphery of the furnace body, wherein an air flow generated by the air flow generating device is blown toward a handle of a device to be tested that is inserted into the furnace body; and
a cooling fan disposed in the housing and below the furnace body, wherein
the air flow generating device comprises:
one or more gas passages arranged on the periphery of the furnace body and communicated with the cooling fan or other gas sources, the gas passage being provided at a bottom end thereof with an air inlet for entering of the air flow, and at a top end thereof with an air outlet for flowing of the air flow to the handle of the device to be tested, and
at least one of a flow guiding fan, an air pump and a blower provided inside the gas passage; and
the gas passage is a rectangular parallelepiped cylinder enclosed by a control board and a control board bracket for installing the control board, wherein the control board bracket is of a rectangular groove structure, a side opening of which is partially covered by the control board, and wherein a mounting plate is provided at an air outlet of the rectangular parallelepiped cylinder, the flow guiding fan is mechanically fixed below the mounting plate, and the mounting plate is provided with an opening corresponding to the position of the flow guiding fan.

2. The flow guiding and heat dissipating type dry block temperature calibrator according to claim 1, wherein the air flow generating device is a single air flow generating device, which is provided on one side of the furnace body, or the air flow generating device is a plurality of air flow generating devices, which are distributed at the periphery of the furnace body.

3. The flow guiding and heat dissipating type dry block temperature calibrator according to claim 1, wherein the control board bracket is positioned on one side of the furnace body, the mounting plate is mechanically fixed on a top end of the control board bracket, and a bottom end of the control board bracket is fixed on a housing base of the dry block temperature calibrator.

4. The flow guiding and heat dissipating type dry block temperature calibrator according to claim 1, wherein the gas passage is the rectangular parallelepiped cylinder, a round cylinder or an air duct arranged on one side of the furnace body.

5. The flow guiding and heat dissipating type dry block temperature calibrator according to claim 1, wherein a furnace base is provided below the furnace body, the cooling fan is disposed in a lower cavity of the furnace base, and at least one vent is formed on a side wall of the furnace base adjacent to the gas passage to form an inlet gas passage, so that the air flow generated by the cooling fan flows to the air inlet below the gas passage.

6. The flow guiding and heat dissipating type dry block temperature calibrator according to claim 1, wherein the air flow generating device includes only the one gas passage arranged on one side of the furnace body and communicated with the cooling fan or an external gas source.

7. The flow guiding and heat dissipating type dry block temperature calibrator according to claim 1, wherein a direction of the air flow generated by the flow guiding fan, the air pump or the blower is vertically upward or inclined to one side of the furnace body.

8. The flow guiding and heat dissipating type dry block temperature calibrator according to claim 6, wherein the gas passage is the rectangular parallelepiped cylinder, a round cylinder or an air duct arranged on the one side of the furnace body.

9. The flow guiding and heat dissipating type dry block temperature calibrator according to claim 2, wherein the air flow generating device includes the gas passages arranged at the periphery of the furnace body and communicated with the cooling fan or an external gas source.

10. The flow guiding and heat dissipating type dry block temperature calibrator according to claim 9, wherein each of the gas passages is provided at a bottom end thereof with one air inlet for entering of the air flow, and each of the gas passages is provided at a top end thereof with one air outlet directed toward the handle of the device to be tested, or all the gas passages are communicated with each other and provided with only one main air outlet directed toward the handle of the device to be tested.

* * * * *